United States Patent
Burkhardt et al.

(10) Patent No.: US 8,927,198 B2
(45) Date of Patent: Jan. 6, 2015

(54) METHOD TO PRINT CONTACT HOLES AT HIGH RESOLUTION

(71) Applicant: International Business Machines Corporation, Armonk, NY (US)

(72) Inventors: Martin Burkhardt, White Plains, NY (US); Yongan Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 13/741,579

(22) Filed: Jan. 15, 2013

(65) Prior Publication Data
US 2014/0199615 A1    Jul. 17, 2014

(51) Int. Cl.
G03F 1/44    (2012.01)
G03F 1/00    (2012.01)

(52) U.S. Cl.
CPC ................................ *G03F 1/144* (2013.01)
USPC ........................................ 430/311; 430/394

(58) Field of Classification Search
CPC ............................. G03F 1/144; G03F 7/70425
USPC ...................... 430/5, 311, 312, 313; 438/618
See application file for complete search history.

(56) References Cited

U.S. PATENT DOCUMENTS

| | | | |
|---|---|---|---|
| 5,821,034 A | 10/1998 | Kim et al. | |
| 6,261,727 B1 | 7/2001 | Wang | |
| 6,563,566 B2 | 5/2003 | Rosenbluth et al. | |
| 6,934,007 B2 | 8/2005 | Fritze et al. | |
| 7,374,865 B2 | 5/2008 | Nyhus et al. | |
| 7,384,725 B2 | 6/2008 | Minvielle et al. | |
| 7,674,703 B1 * | 3/2010 | Schiwon et al. | 438/618 |
| 2003/0027366 A1 | 2/2003 | Dulman et al. | |
| 2007/0177123 A1 | 8/2007 | Tel et al. | |
| 2009/0104542 A1 | 4/2009 | Nyhus et al. | |
| 2012/0083124 A1 | 4/2012 | Huang et al. | |

FOREIGN PATENT DOCUMENTS

| | | |
|---|---|---|
| EP | 1221072 B1 | 7/2002 |
| KR | 20050089291 A | 9/2005 |
| KR | 20090050699 A | 5/2009 |
| KR | 20110079956 A | 7/2011 |

OTHER PUBLICATIONS

International Search Report dated May 13, 2014 issued in PCT/US2014/010574.

* cited by examiner

*Primary Examiner* — Stephen Rosasco
(74) *Attorney, Agent, or Firm* — Scully, Scott, Murphy & Presser, P.C.; Parashos T. Kalaitzis, Esq.

(57) ABSTRACT

A two-dimensional dense array of contact holes can be printed on a negative photoresist employing a combination of a quadrupole illumination lens and a lithographic mask including a criss-cross pattern of opaque lines. The openings in the quadrupole illumination lens are aligned along the perpendicular directions of the opaque lines. Discrete contact holes can be printed on a negative photoresist employing a combination of a quadrupole illumination lens and a lithographic mask including a criss-cross pattern of opaque sub-resolution assist features and discrete opaque cross patterns. Alternately, a two-dimensional array of contact holes can be printed on a negative photoresist employing a quadrupole illumination lens and a checkerboard pattern of openings. The openings in the quadrupole illumination lens are in diagonal directions.

25 Claims, 12 Drawing Sheets

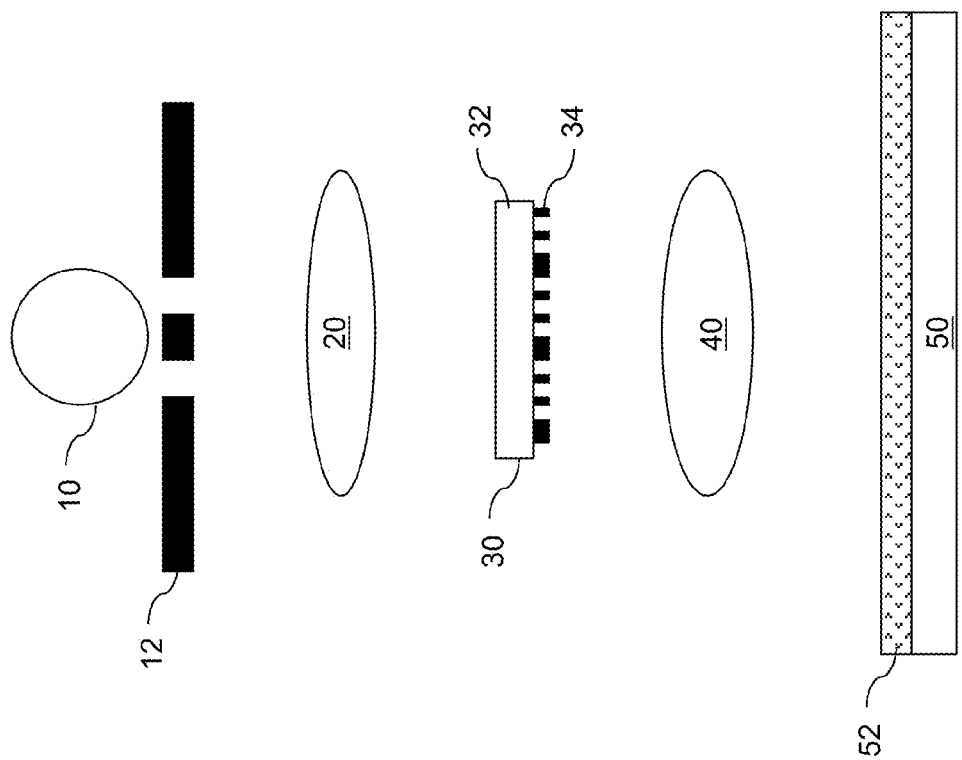

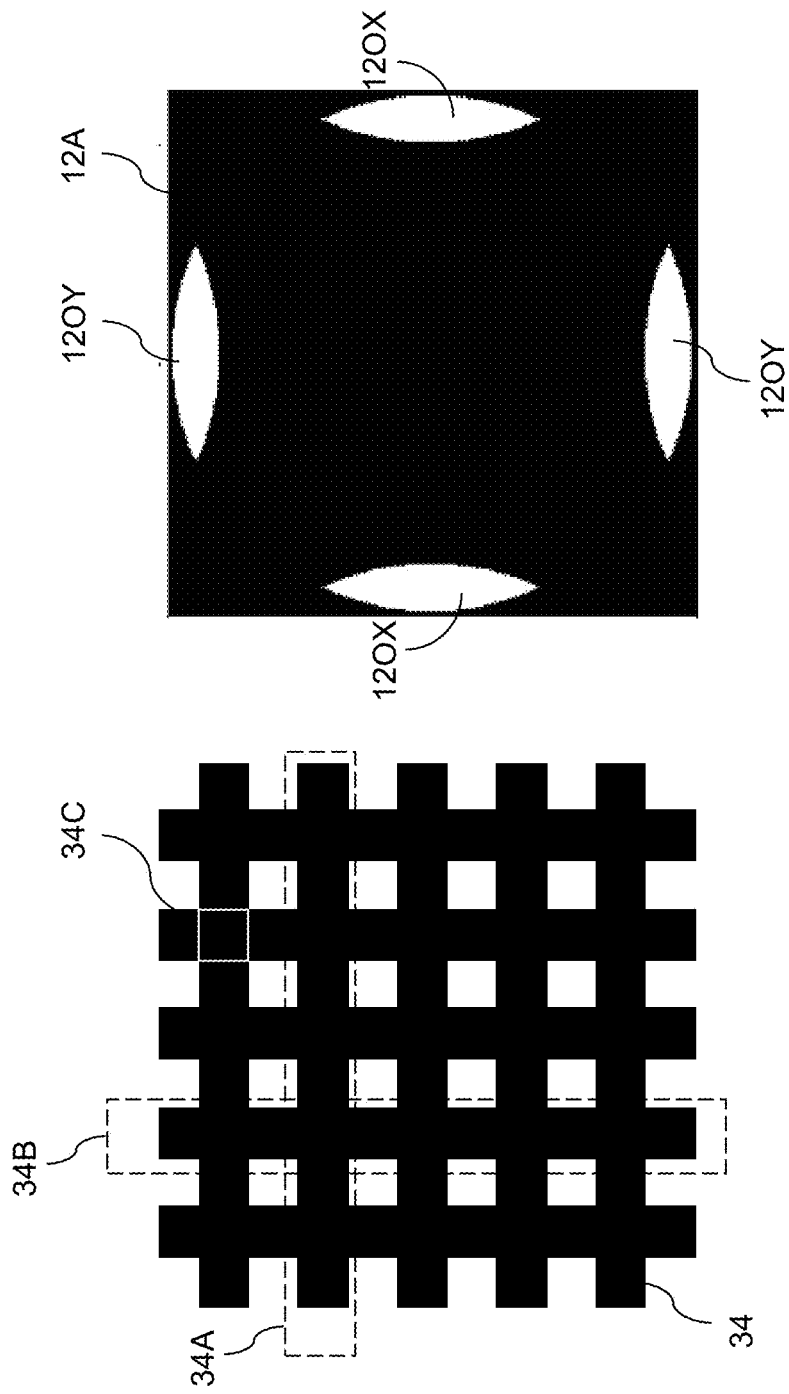

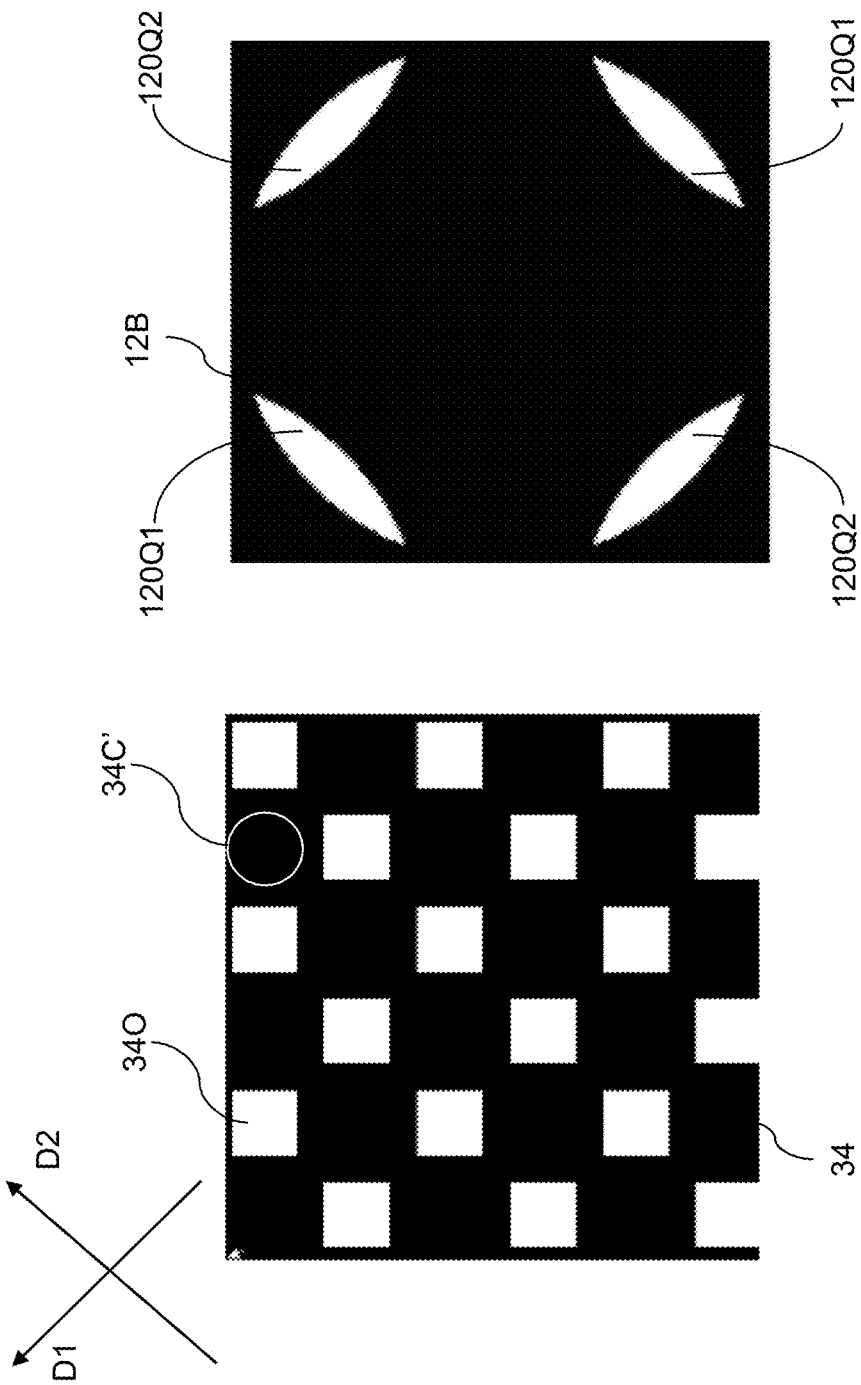

US 8,927,198 B2

METHOD TO PRINT CONTACT HOLES AT HIGH RESOLUTION

BACKGROUND

The present disclosure relates to a method for designing a contact hole mask for use with a negative photoresist, and a system for effecting the same.

For printing of a two-dimensional array of contact holes, a solution for defining the image on a photoresist relies on peaks in the aerial image, which have lower contrast than valleys in the aerial image. For this reason, a positive photoresist tends to provide less resolution than a negative photoresist because the part of the aerial image having the greatest intensity contrast cannot be used to define the contact holes in the case of positive photoresists. Thus, a method for enhancing the contrast of an image for a two-dimensional array of contact holes for a negative photoresist is desired.

SUMMARY

A two-dimensional dense array of contact holes can be printed on a negative photoresist employing a combination of quadrupole illumination and a lithographic mask including a criss-cross pattern of opaque lines. The light direction of the quadrupole illumination is aligned perpendicular to the lengthwise directions of the opaque lines. Discrete contact holes can be printed on a negative photoresist employing a combination of a cross-quadrupole illumination and a lithographic mask including a criss-cross pattern of opaque sublithographic assist features and discrete opaque cross patterns. Alternately, a two-dimensional array of contact holes can be printed on a negative photoresist employing a quadrupole illumination lens and a checkerboard pattern of openings. The openings in the quadrupole illumination lens are in diagonal directions if contact holes to be printed are arranged in a vertical/horizontal grid.

According to an aspect of the present disclosure, a method for printing a plurality of contact holes in a photoresist is provided. A reticle is provided, which includes a transparent substrate and a patterned opaque material layer thereupon, the patterned opaque material layer includes a criss-cross grid of intersections of a set of first parallel opaque lines and a set of second parallel opaque lines. The reticle is loaded in a lithographic exposure tool. A substrate with a negative photoresist layer thereupon is loaded into the lithographic exposure tool. The negative photoresist layer is lithographically exposed and developed. An array of holes is formed in areas of the lithographically un-exposed and developed negative photoresist layer that correspond to intersections of the set of first parallel opaque lines and the set of second parallel opaque lines.

According to another aspect of the present disclosure, a method of generating a design for a patterned opaque material layer of a reticle is provided. A pattern is generated, which includes a criss-cross grid of intersections of a set of first parallel opaque subresolution assist features (SRAFs) and a set of second parallel opaque SRAFs that are perpendicular to the first parallel opaque SRAFs. The pattern is modified by substituting an opaque cross pattern for each intersection of the criss-cross pattern that corresponds to a contact hole in a design layout, the opaque cross pattern having widths greater than the first parallel opaque SRAFs and the second parallel opaque SRAFs. A design for a patterned opaque material layer of a reticle is generated by applying optical proximity correction to the modified pattern.

According to yet another aspect of the present disclosure, a method for printing a plurality of contact holes in a photoresist is provided. A reticle is provided, which includes a transparent substrate and a patterned opaque material layer thereupon. The patterned opaque material layer includes a crisscross grid of intersections of a set of first parallel opaque subresolution assist features (SRAFs) and a set of second parallel opaque SRAFs that are perpendicular to the first parallel opaque SRAFs. The patterned opaque material layer further includes discrete opaque cross patterns having widths greater than the first parallel opaque SRAFs and the second parallel opaque SRAFs. The reticle is loaded in a lithographic exposure tool. A substrate with a negative photoresist layer thereupon is loaded into the lithographic exposure tool. The negative photoresist layer is lithographically exposed and developed. A plurality of holes is formed in areas of the lithographically un-exposed and developed negative photoresist layer that correspond to the discrete opaque cross patterns.

According to still another aspect of the present disclosure, a method for printing a plurality of contact holes in a photoresist is provided. A reticle including a transparent substrate and a patterned opaque material layer thereupon is provided. The patterned opaque material layer includes a checkerboard pattern of discrete holes and opaque material portions, wherein the opaque material portions are interconnected among one another. The reticle is loaded in a lithographic exposure tool. A substrate with a negative photoresist layer thereupon is loaded into the lithographic exposure tool. The negative photoresist layer is lithographically exposed and developed. An array of holes is formed in areas of the lithographically unexposed and developed negative photoresist layer that correspond to the opaque material portions.

According to even another aspect of the present disclosure, a system for printing a plurality of contact holes in a photoresist is provided. The system can include the lithographic exposure tool and the reticle as described above.

BRIEF DESCRIPTION OF THE SEVERAL VIEWS OF THE DRAWINGS

FIG. 1 is an exemplary lithographic system according to an embodiment of the present disclosure.

FIG. 2A is an opaque material layer for a first exemplary lithographic mask according to a first embodiment of the present disclosure.

FIG. 2B is an illuminator to be employed in conjunction with the first exemplary lithographic mask of FIG. 2A according to the first embodiment of the present disclosure.

FIG. 12A is an opaque material layer for a second exemplary lithographic mask according to a second embodiment of the present disclosure.

FIG. 12B is an illuminator to be employed in conjunction with the second exemplary lithographic mask of FIG. 12A according to the second embodiment of the present disclosure.

DETAILED DESCRIPTION

Figure 3B:
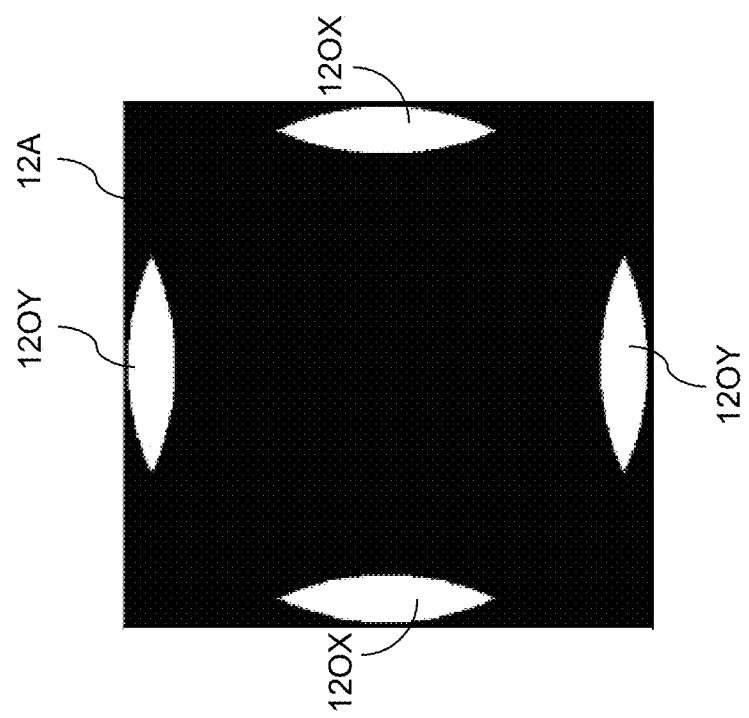
FIG. 3B is an illuminator to be employed in conjunction with the comparative exemplary lithographic mask of FIG. 3A.

As stated above, the present disclosure relates to a method for designing a contact hole mask for use with a negative photoresist, and a system for effecting the same, which are now described in detail with accompanying figures. It is noted that like and corresponding elements mentioned herein and illustrated in the drawings are referred to by like reference numerals.

In the present disclosure, a "negative photoresist" is defined a photoresist for which the unexposed portions of the photoresist is developed and removed in a developer. It is noted that the same photoresist material can be used as a positive photoresist or as a negative photoresist depending on the type of solution employed to develop the photoresist. For example, some photoresist materials can be employed as a positive photoresist if it is developed with a basic Tetramethylammonium Hydroxide (TMAH) solution, and can be employed as a negative photoresist when developed with a solvent. Because TMAH has been used for decades as a standard developer, a negative photoresist has been known in the art as a photoresist that removes unexposed resist in a TMAH solution. As noted above, the definition of a "negative photoresist" as used herein is different from the definition used in the art (that relies on a TMAH solution as the basis for determining whether a photoresist material is to be classified as a positive photoresist material or a negative photoresist material).

To illustrate the operation of a positive photoresist and a negative photoresist, the following explanation is provided. In a typically lithographic system employing a positive photoresist, a lithographic mask such as one shown in FIG. 2A would be employed. The black area corresponds to an opaque (absorbent) area and the white area corresponds to the transparent (clear) area. The contact holes would print in the area of the positive photoresist that corresponds to the transparent area of the lithographic mask. If the polarity of the photoresist is changed from positive to negative, one would expect to just reverse the polarity of the pattern on a corresponding lithographic mask and provide a pattern as shown in FIG. 3A. This reversal of the polarity of the pattern on the lithographic mask is an obvious reaction one would take. The present disclosure teaches that use of the lithographic pattern in FIG. 2A for the positive photoresist can provide a better performance than the 'obvious' pattern for the lithographic mask in FIG. 3A that one would naturally use in conjunction with reversal of the polarity. When the pattern of FIG. 2A is employed in conjunction with a positive photoresist, instead of printing contact holes in areas of a negative photoresist that correspond to the transparent areas of the lithographic mask of FIG. 2A, the contact holes will be printed in areas of the positive photoresist that correspond to the opaque areas the lithographic mask of FIG. 2A. Further, lithographic dose would need to be adjusted relative to a process that employs a negative photoresist in order to prevent merging of contact holes in proximity with one another (which would result in printing of a checkerboard pattern that replicates all opaque areas of FIG. 2A instead of patterning only the subset of the opaque areas that correspond to the intersection of criss-cross lines).

Referring to FIG. 1, an exemplary lithographic apparatus that can be employed to implement an embodiment of the present disclosure is schematically illustrated. The exemplary lithographic apparatus is a lithographic exposure system that includes a light source 10, an illuminator 12, a condenser lens 20, a reticle 30 (i.e., a lithographic mask), a projection lens 40, and a substrate 50 with a photoresist layer 52 thereupon. The light source 10, the illuminator 12, the condenser lens 20, and the projection lens 40 can be provided as components of a lithographic exposure tool. The reticle 30 can be inserted and affixed to the lithographic exposure tool. The optimal location for placing the reticle 30 within the lithographic exposure tool is determined by the optics of the lithographic exposure system. The substrate 50 and the photoresist layer 52 thereupon can be loaded into the lithographic exposure system. The optimal location of the substrate 50 and the photoresist layer 52 is determined by the optics of the lithographic exposure system. In immersion lithography systems as used in the experiments shown here, a fluid can be inserted between the projection lens 40 and the resist coated wafer 50/52 in order to increase the resolution and the process window of the lithographic system.

The light source 10 is configured to emit an electromagnetic radiation at a predefined wavelength, which is herein referred to as an illumination beam. The electromagnetic radiation can be an X-ray radiation (having a wavelength in a range from 0.01 nm to 10 nm), or can be an ultraviolet (UV) radiation (having a wavelength in a range from 10 nm to 400 nm).

The illuminator 12 includes an aperture or other beam shaping optics configured to let the electromagnetic radiation from the light source 10 through in a predefined pattern corresponding to the shape of the aperture. The aperture can be circular, elliptical, dipolar, multipolar, or can have any other shape configured to provide optimized angular distribution of light for the specific pattern in the reticle 30.

The condenser lens 20 focuses the electromagnetic radiation at the plane of the reticle 30. The reticle 30 can include a transparent substrate 32 and a patterned opaque material layer 34. In one embodiment, the condenser lens 20 can focus the electromagnetic radiation at the plane of the patterned opaque material layer 34. As used herein, a material is "transparent" if more than 90% of electromagnetic radiation passes through at a wavelength within the wavelength range from 0.01 nm to 400 nm, and a material is "opaque" if less than 10% of electromagnetic radiation passes through at a wavelength within the wavelength range from 0.01 nm to 400 nm.

Referring to FIG. 2A, a patterned opaque material layer 34 for a first exemplary lithographic mask, i.e., a reticle, is shown according to a first embodiment of the present disclosure. The area of the patterned opaque material layer 34 is shown in black areas. The first exemplary lithographic mask includes a pattern for a rectangular array of contact holes that can be printed on a negative photoresist. A negative photoresist is a photoresist that includes a material that cross-links upon irradiation by electromagnetic radiation. The cross-linked portions of a negative photoresist become insoluble in a solvent that removes the unirradiated portions (that do not have cross-linking) of the negative photoresist. In the case presented here, a negative photoresist material is a material that does not cross-link during exposure, but instead removes the unirradiated portions of the resist due to the use of a solvent developer, in a process called negative tone development.

Specifically, the patterned opaque material layer 34 can include a criss-cross grid of intersections 34C of a set of first parallel opaque lines 34A and a set of second parallel opaque lines 34B. As used herein, a "criss-cross" grid refers to a grid including intersecting elements. Thus, each of first parallel opaque lines 34A intersects with each of the second parallel opaque lines 34B.

Each of the first parallel opaque lines 34A can have a same width, which is referred to as a first width, and the spacing between each neighboring pair of first parallel opaque lines 34A can be the same, which is herein referred to as a first spacing. Thus, the first parallel opaque lines 34A can form a one-dimensional periodic array of opaque lines separated by transparent areas of the lithographic mask. The sum of the first width and the first spacing is the pitch of the first parallel opaque lines 34A, which is herein referred to as a first pitch.

Likewise, each of the second parallel opaque lines 34B can have a same width, which is referred to as a second width, and the spacing between each neighboring pair of second parallel opaque lines 34B can be the same, which is herein referred to as a second spacing. Thus, the second parallel opaque lines 34B can form a one-dimensional periodic array of opaque lines separated by transparent areas of the lithographic mask. The sum of the second width and the second spacing is the pitch of the second parallel opaque lines 34B, which is herein referred to as a second pitch.

The second width can be the same as, or can be different from, the first width. The first spacing can be the same as, or can be different from, the second spacing. The first pitch can be the same as, or can be different from, the second pitch.

In one embodiment, the lengthwise direction of the first parallel opaque lines 34A can be perpendicular to the lengthwise direction of the second parallel opaque lines 34B. In this case, each of the intersections 34C can have a rectangular shape. Thus, the criss-cross grid of intersections 34C of the set of first parallel opaque lines 34A and the set of second parallel opaque lines 34B can be a two-dimensional rectangular array of intersections 34C having a periodicity of the first pitch along the direction of repetition of the first parallel opaque lines 34A and having the second pitch along the direction of repetition of the second parallel opaque lines 34B. In this case, each intersection 34C can have the first width along the direction of the first pitch, and can have the second width along the direction of the second pitch.

A lithographic mask 30 (See FIG. 1) employing a patterned opaque material layer 34 illustrated in FIG. 2A is a dark field mask that minimizes the impact of zeroth diffracted order radiation when exposed with radiation of an illuminator illustrated in FIG. 2B. When employed in conjunction with a negative photoresist, a pattern of isolated contact holes can be formed by lithographically unexposed portions of the negative photoresist that correspond to the intersections 34C of the patterned opaque material layer 34, i.e., by portions of the negative photoresist that are shielded by the illuminating electromagnetic radiation by the intersections 34C of the patterned opaque material layer 34.

The portions of the patterned opaque material layer 34 that do not belong to the intersections 34C do not result in a printed lithographic image. Specifically, all areas of the negative photoresist layer corresponding to the portions of the patterned opaque material layer 34 other than the intersections 34C upon "scaled mapping" of the pattern of the lithographic mask onto the area of the negative photoresist layer, are illuminated by the rays of the illumination beam. During a scaled mapping of a photoresist layer to a lithographic mask, the area of the photoresist layer is linearly scaled by an image reduction factor, which is the ratio of lateral dimensions of features in the lithographic mask to the corresponding lateral dimensions of features in the printed image in the photoresist layer. It is understood that the shape of each image of the intersection 34C, as printed in the negative photoresist layer, can be distorted from the shape of the corresponding intersection 34C due to lithographic effects (such as shape rounding).

The illumination of all areas of the negative photoresist layer corresponding to the portions of the patterned opaque material layer 34 other than the intersections 34C upon scaled mapping is because the lithographic image of the pattern of the two-dimensional array in the patterned opaque material layer 34 includes two sinusoidal intensity variations that are juxtaposed on the image plane at the negative photoresist layer. Specifically, the pattern of the first parallel opaque lines 34A generate sinusoidal illumination intensity variation pattern along the direction of the first pitch at the plane of the negative photoresist layer, and the pattern of the second parallel opaque lines 34B generate sinusoidal illumination intensity variation pattern along the direction of the second pitch at the plane of the negative photoresist layer. Thus, only the areas of the negative photoresist layer corresponding to the area of the intersections 34 are illuminated with sufficiently low intensity of diffracted rays of the illumination beam so as to prevent exposure of the negative photoresist material, while all other areas of the negative photoresist layer are illuminated with sufficiently high intensity of diffracted rays of illumination beams and become lithographically exposed, i.e., this material will not be developed in the negative resist process.

A quadrupole illuminator 12A illustrated in FIG. 2B can be employed with a lithographic mask 30 (See FIG. 1) having a patterned opaque material layer 34 illustrated in FIG. 2A in a lithographic apparatus illustrated in FIG. 1 to print a rectangular array of contact holes in a negative photoresist, which can be in a photoresist layer 52 of FIG. 1. The quadrupole illuminator 12A of FIG. 2B can be optimized to optimize contrast by reducing the zeroth diffracted order rays of the illumination beam. Thus, the area corresponding to the source image of the light source 10 is blocked or otherwise shaped within the quadrupole illuminator 12A. Alternatively, instead of using apertures or blocks for such beam shaping, the beam may be 'shaped' through an elaborate optics system in order to avoid a loss of intensity or thrown-away light.

In one embodiment, the four discrete openings can include a first pair of openings aligned along a lengthwise direction of the set of first parallel opaque lines 34A (e.g., an x direction in FIG. 2B) and a second pair of openings aligned along a lengthwise direction of the set of second parallel opaque lines 34B (e.g., a y direction in FIG. 2B). The lithographic system can be employed to print a plurality of contact holes in the photoresist layer 52.

In one embodiment, the quadrupole illuminator 12A can have a pair of first openings 120X along the direction perpendicular to the lengthwise direction of the first parallel opaque lines 34B, and a pair of second openings 120Y along the direction perpendicular to the lengthwise direction of the second parallel opaque lines 34A (Note: the part of the illuminator denoted by 120X generates contrast for vertical lines along 34B, the part of the illuminator denoted by 120Y generates contrast for horizontal lines along 34A). If we take the outline of the square 12A in FIG. 2B to have side length of 2, then a circle that just fits into the square has a radius of unity. Each point in this circle symbolizes a possible direction of illumination of light incident on the reticle. The preferred such areas of illumination 120X and 120Y then are centered around the location of $\lambda/NA/p/2$, in which $\lambda$ is the wavelength of the illumination beam and NA is the numerical aperture of the lithographic projection apparatus, and p is the pitch of the pattern on the reticle that as defined above. Clearly, in a unity circle we cannot have a pitch p that is smaller than $\lambda/NA/2$ and prints, which represents the physical limitation of this projection system. The closer one gets to this pitch on the reticle 2A the closer the center of the illumination areas 120X and 120Y move to a radius of unity in FIG. 2B. For example, for ArF wavelength of 193.5 nm and a state-of-the-art water immersion scanner with 1.35 NA, a physical cut-off is at 71.6 nm pitch, which would be impossible to print. The method of the present disclosure enables printing of 80 nm pitch with good image resolution, which is hard with prior art methods and impossible with process control required for manufacturing.

In one embodiment, a plurality of contact holes can be printed in a photoresist layer 52 (See FIG. 1), for example, by providing a reticle, i.e., a lithographic mask 30, including a transparent substrate 32 and a patterned opaque material layer 34 thereupon. The patterned opaque material layer can have the pattern illustrated in FIG. 2A. The reticle can be loaded into such a lithographic exposure tool as illustrated in FIG. 1. A substrate 50 with a photoresist layer 52, which can be a negative photoresist layer, thereupon can be loaded into the lithographic exposure tool. The negative photoresist layer can be lithographically exposed and developed. An array of holes is formed in areas of the lithographically exposed and developed negative photoresist layer that correspond to intersections 34C of the set of first parallel opaque lines 34A and the set of second parallel opaque lines 34B.

In one embodiment, the set of first parallel opaque lines and the set of second parallel opaque lines can define a two dimensional array of rectangular openings within the patterned opaque material layer 34, which is shown as white rectangles in FIG. 2A.

The negative photoresist layer is developed after lithographic exposure. After the lithographic exposure and development of the negative photoresist layer, a remaining portion of the negative photoresist layer is present for each area of the reticle located outside the intersections 34C. Thus, the lithographically exposed portions of the negative photoresist layer have the same pattern as the pattern of a combined area that includes the transparent areas of the reticle and opaque areas of the reticle in which the portions of the patterned opaque material layer 34 that do not correspond to the intersections.

In case the criss-cross grid of intersections includes a two-dimensional periodic array, and the set of first parallel opaque lines 34A has a first pitch and the set of second parallel opaque lines 34B has a second pitch, the width of each of opaque line among the set of first parallel opaque lines 34A can be in a range from 31.25% of the first pitch to 62.5% of the first pitch, and the width of each of opaque line among the set of second parallel opaque lines 34B can be in a range from 31.25% of the second pitch to 62.5% of the second pitch.

Referring to FIG. 3A, a patterned opaque material layer 34 for a comparative exemplary lithographic mask, i.e., a reticle, is shown for the purpose of comparison with the first exemplary lithographic mask shown in FIG. 2A. The area of the patterned opaque material layer 34 is shown in black areas. The comparative exemplary lithographic mask includes a pattern for a rectangular array of contact holes that can be printed on a negative photoresist. Specifically, the patterned opaque material layer 34 can include a rectangular array of isolated opaque regions 34C'.

Each of the isolated opaque regions 34C' can have the same shape and size, and can be aligned as a two-dimensional array. In one embodiment, the two-dimensional array in the comparative exemplary lithographic mask can have the same pitch as the first pitch of the first exemplary lithographic mask along a first direction of periodicity within the comparative exemplary lithographic mask. Further, the two-dimensional array in the comparative exemplary lithographic mask can have the same pitch as the second pitch of the first exemplary lithographic mask along a second direction of periodicity within the comparative exemplary lithographic mask. In one embodiment, the first direction of periodicity and the second direction of periodicity can be perpendicular to each other in the comparative exemplary lithographic mask.

In one embodiment, each isolated opaque region 34C' can have a rectangular shape. In one embodiment, the width of each isolated opaque region 34C' along the first direction of periodicity can be the same as the first width of the first exemplary lithographic mask, and the width of each isolated opaque region 34C' along the second direction of periodicity can be the same as the second width of the first exemplary lithographic mask.

A lithographic mask 30 (See FIG. 1) employing a patterned opaque material layer 34 illustrated in FIG. 3A is not a dark field mask, and thus, unlike the first exemplary lithographic mask illustrated in FIG. 2A, does not minimize the impact of zeroth diffracted order radiation in that the zeroth diffracted order is much larger than the first diffracted order of light. When the comparative exemplary lithographic mask of FIG. 3A is employed in conjunction with a negative photoresist, a pattern of isolated contact holes can be formed by lithographically unexposed portions of the negative photoresist that correspond to the isolated opaque regions 34' of the patterned opaque material layer 34, i.e., by portions of the negative photoresist that are shielded by the illuminating electromagnetic radiation by the isolated opaque regions 34' of the patterned opaque material layer 34.

The portions of the patterned opaque material layer 34 that do not belong to the isolated opaque regions 34C' do not result in a printed lithographic image. Specifically, all areas of the negative photoresist layer corresponding to the portions of the patterned opaque material layer 34 other than the isolated opaque regions 34C' upon scaled mapping are illuminated by the rays of the illumination beam.

A pattern of rectangular array of contact holes is formed in the negative photoresist layer. The intensity contrast obtained at the pattern of the contact holes formed with the comparative exemplary lithographic mask of having the pattern of FIG. 3A is less than the intensity contrast obtained at a pattern of contact holes formed with the first exemplary lithographic mask of FIG. 2A because the portions of the negative photoresist layer corresponding to the areas of the contact holes are subjected to tail ends of sinusoidal intensity variation along two independent directions, i.e., tail ends of a first sinusoidal intensity variation along the x direction and a second sinusoidal intensity variation along the y direction.

Figure 3A:
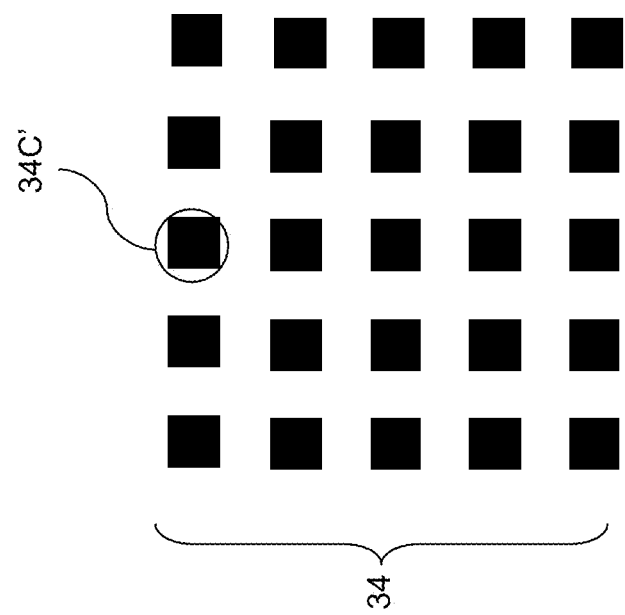
FIG. 3A is an opaque material layer for a comparative exemplary lithographic mask.

A quadrupole illuminator 12A illustrated in FIG. 3B can be employed with a lithographic mask 30 (See FIG. 1) having a patterned opaque material layer 34 illustrated in FIG. 3A in a lithographic apparatus illustrated in FIG. 1 to print a rectangular array of contact holes in a negative photoresist, which can be in a photoresist layer 52 of FIG. 1. The quadrupole illuminator 12A of FIG. 3B can be optimized to maximize contrast in the photoresist. In one embodiment, the illuminator 12A of FIG. 3B may be optimized for contrast alone, and the strength of the diffracted orders may be given by the lithographic mask of FIG. 2A or FIG. 3A. The quadrupole illuminator 12A of FIG. 3B can be the same as the quadrupole illuminator 12A of FIG. 2B.

The negative photoresist layer is developed after lithographic exposure. After the lithographic exposure and development of the negative photoresist layer, a remaining portion of the negative photoresist layer is present for each area of the reticle located outside the isolated opaque regions 34C'. Thus, the lithographically exposed portions of the negative photoresist layer have the same pattern as the pattern of the isolated opaque regions 34C'.

Figure 4:
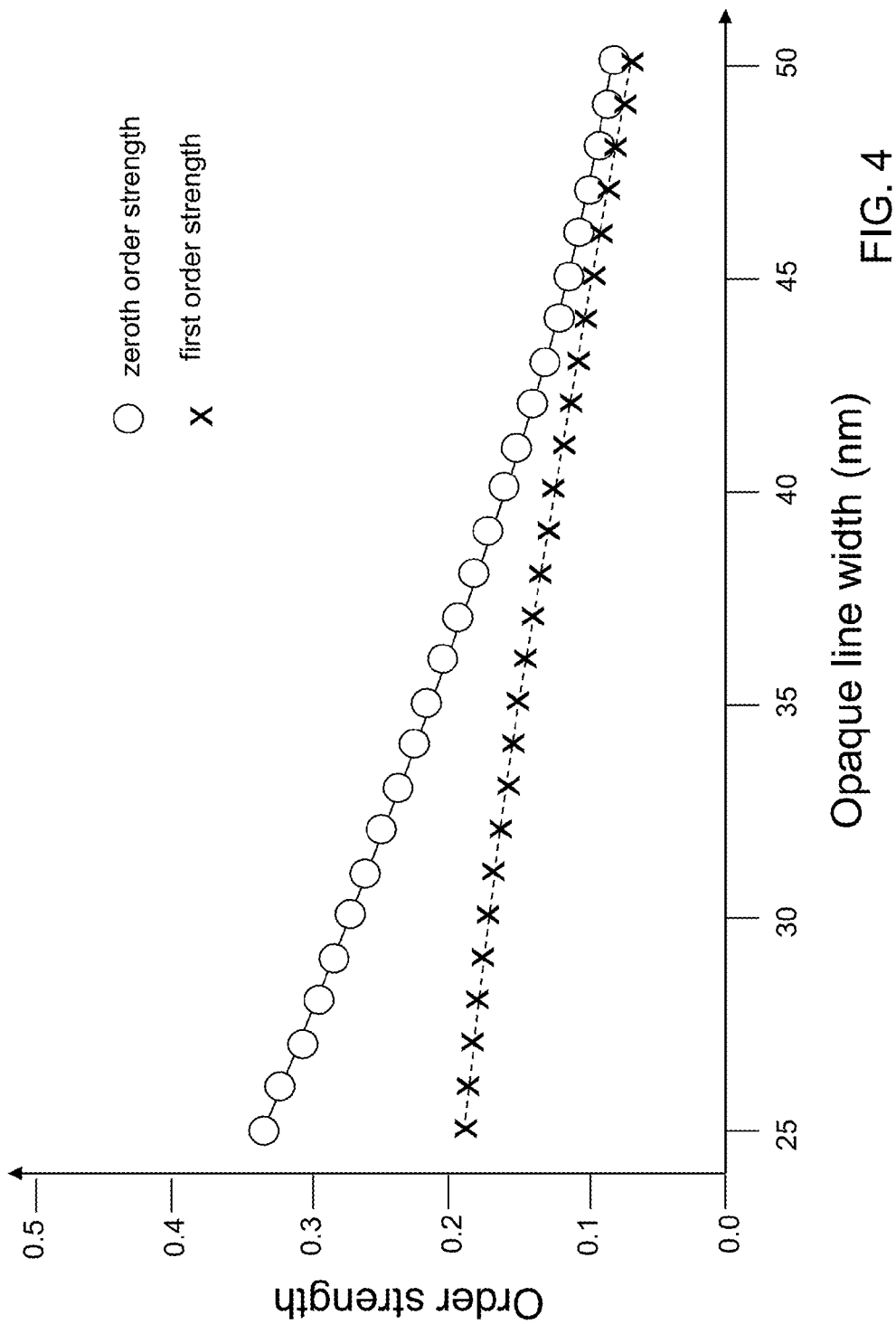
FIG. 4 is a graph illustrating the diffraction order strengths as a function of an opaque line width for an 80 nm pitch first exemplary lithographic mask according to an embodiment of the present disclosure.

Referring to FIG. 4, a graph illustrates the order strengths as a function of an opaque line width for an 80 nm pitch first exemplary lithographic mask having the pattern shown in FIG. 2A and illumination shown in FIG. 2B. As used herein, an "order strength" refers to the intensity of a diffracted order that is transmitted through the openings of a mask shown in FIG. 2A and is then recombined through an objective (or projection) lens 40 on the wafer 50 in a photoresist layer 52 (See FIG. 1). The order strength is given relative to an open mask, so it represents the ratio of the diffracted order intensity to the open zeroth order in the absence of a pattern on a mask shown in FIG. 2A. A first diffracted order intensity of similar magnitude to the zeroth diffracted order intensity creates an image close to a sine wave in in one direction, giving rise to an image of high contrast.

For the purpose of this simulation, a 193 nm illumination source with a quadrupole illuminator having the pattern of FIG. 2B was assumed. The numerical aperture was set at 1.35, as is commonly found on state-of-the-art projection systems. An illumination pattern for a rectangular array of contact holes was obtained at the plane of a photoresist layer. The first width and the second width, i.e., the width of the opaque lines along the two directions of periodicity, were set to be the same. The common variable of the first width and the second width was given the name "opaque line width," and was varied between 25 nm to 50 nm during the simulation.

Figure 5:
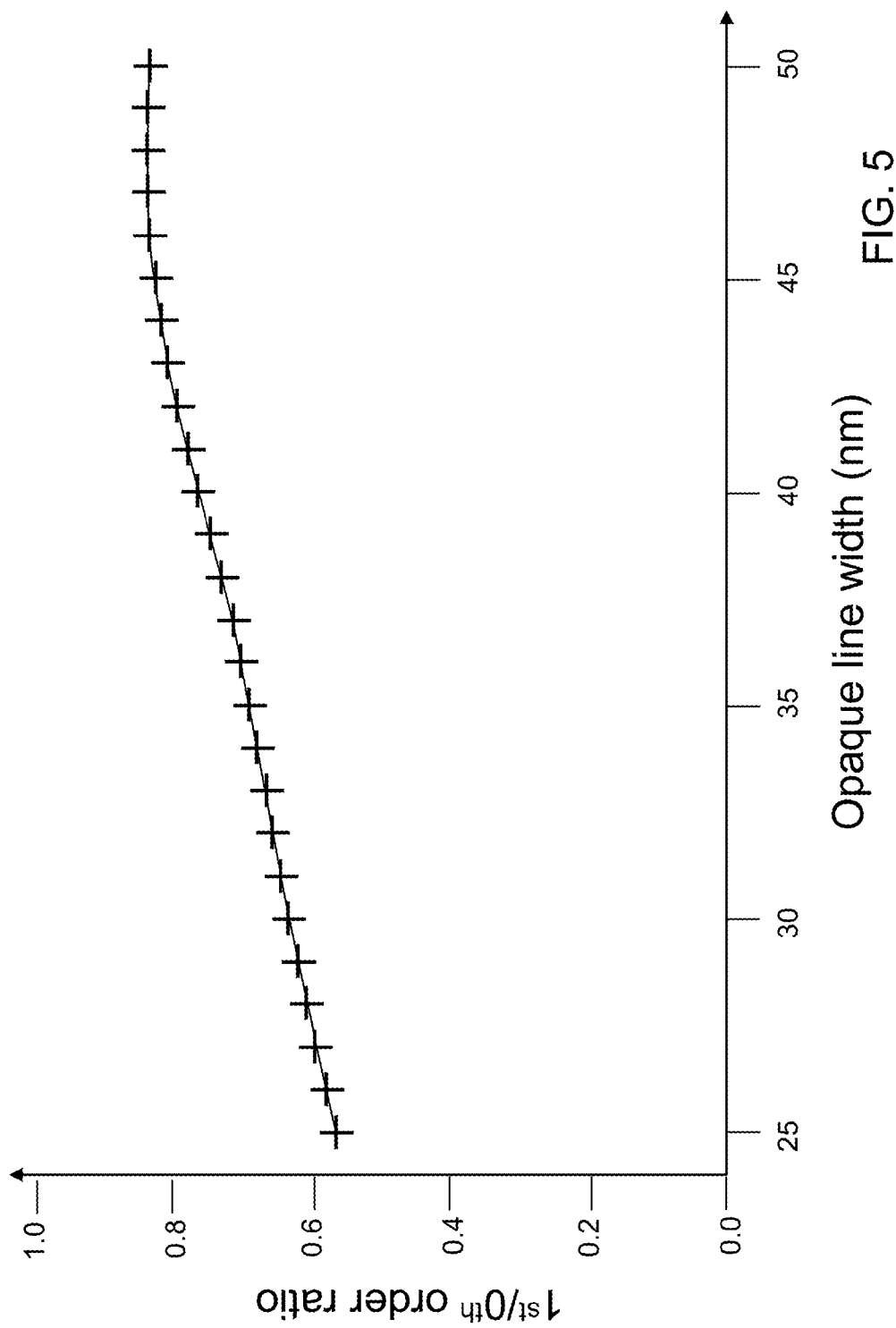
FIG. 5 is a graph illustrating the ratio of the first diffraction order strength to the zeroth diffraction order strength as a function of an opaque line width for an 80 nm pitch first exemplary lithographic mask according to an embodiment of the present disclosure.

FIG. 5 is a graph illustrating the ratio of the first diffracted order strength to the zeroth diffracted order strength as a function of an opaque line width for the 80 nm pitch first exemplary lithographic mask having the pattern shown in FIG. 2A.

FIGS. 4 and 5 collectively show that the ratio of the first order strength to the zeroth order strength improves, i.e., increases, with the opaque line width from about 0.55 for the opaque line width of 25 nm to about 0.82 for the opaque line width of 50 nm. A high ratio of first to zeroth diffracted orders gives rise to an image with good contrast in the photoresist.

Figure 6:
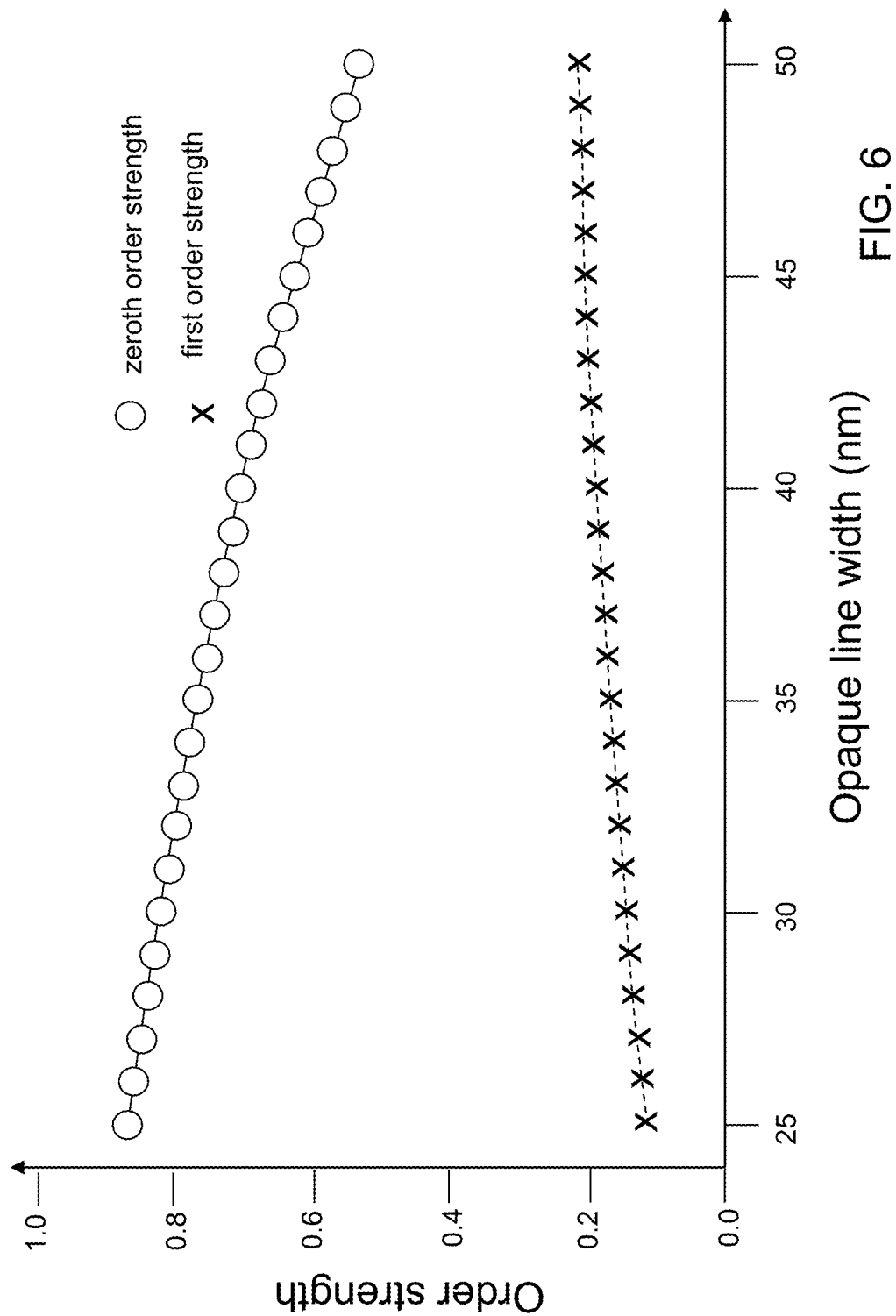
FIG. 6 is a graph illustrating the diffraction order strengths as a function of an opaque line width for an 80 nm pitch comparative exemplary lithographic mask according to an embodiment of the present disclosure.

Referring to FIG. 6, a graph illustrates the order strengths as a function of an opaque line width for an 80 nm pitch comparative exemplary lithographic mask having the pattern shown in FIG. 3A. For the purpose of this simulation, a 193 nm illumination source with a quadrupole illuminator having the pattern of FIG. 3B (which is the same as the pattern of FIG. 2B) was assumed. The numerical aperture was set at 1.35. An illumination pattern for a rectangular array of contact holes was obtained at the plane of a photoresist layer. The isolated opaque regions 34C' had a square shape, and each side of the square shape had the same length, which is referred to as an "opaque line width." The opaque line width was varied between 25 nm to 50 nm during the simulation.

FIG. 6 is a graph illustrating the ratio of the first order strength to the zeroth order strength as a function of an opaque line width for the 80 nm pitch comparative exemplary lithographic mask having the pattern shown in FIG. 3A. The zeroth diffracted order strength is much larger than the first diffracted order strength, indicating that the resulting image in photoresist is of poor contrast. The resulting image is thus of poor quality and process window. This means that it may print, but even small process variations in dose or focus can destroy the image. For larger opaque line width beyond 50 nm the zeroth order strength continues to decrease and the strength of zeroth and first diffracted orders become slightly better matched. However, even for very large opaque line widths the relative strengths of the zeroth and first diffracted orders stay so far apart that no good image can is formed. For large opaque line widths it is also very difficult to make the reticle because a opaque width of 50 nm at an 80 nm pitch yields only 30 nm of clear size. Such small and even smaller clear dimensions are very hard to manufacture and to control on a reticle.

Figure 7:
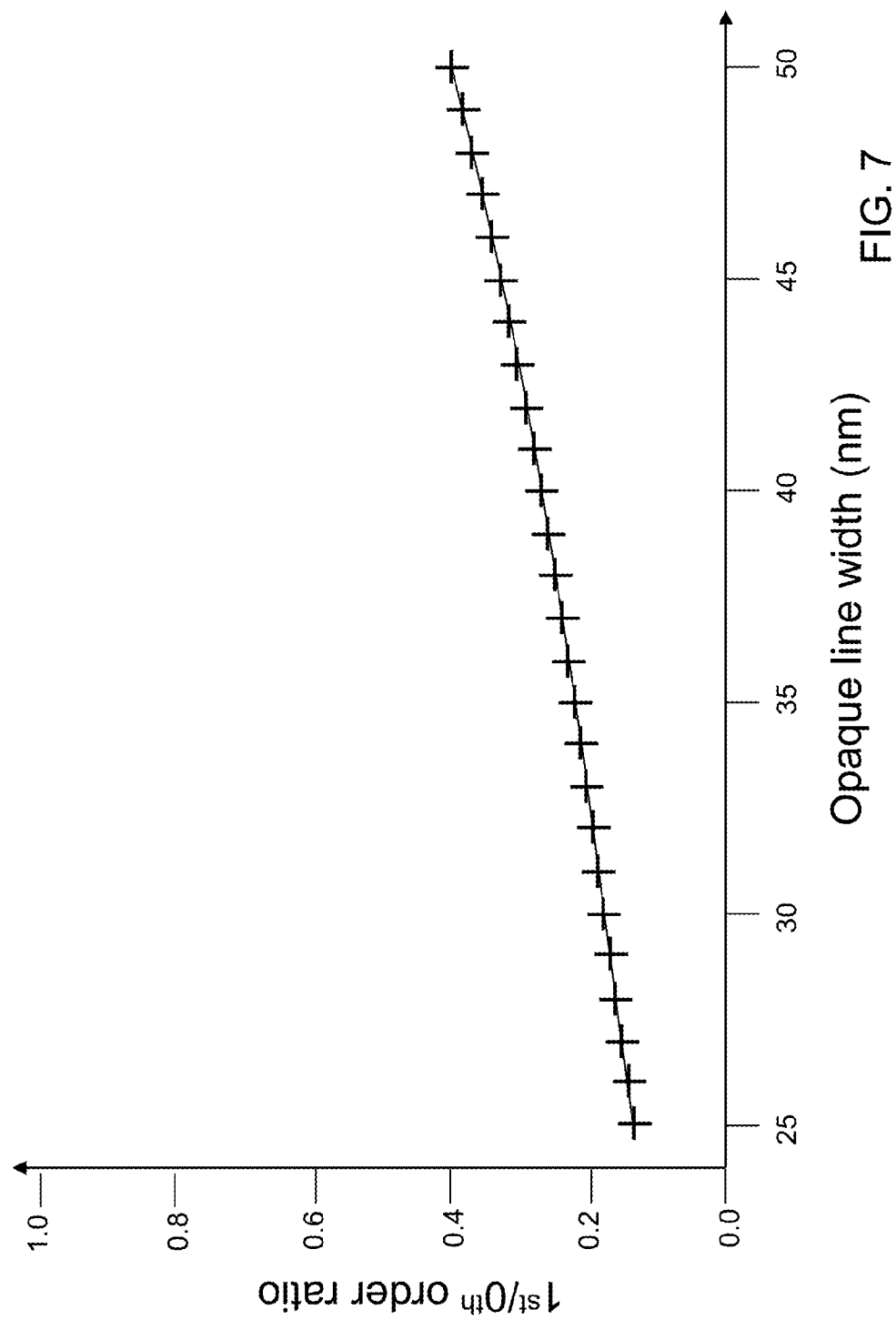
FIG. 7 is a graph illustrating the ratio of the first diffraction order strength to the zeroth diffraction order strength as a function of an opaque line width for an 80 nm pitch comparative exemplary lithographic mask according to an embodiment of the present disclosure.

FIGS. 6 and 7 collectively show that the ratio of the first order strength to the zeroth order strength improves, i.e., increases, with the opaque line width from about 0.13 for the opaque line width of 25 nm to about 0.40 for the opaque line width of 50 nm.

Comparison of FIGS. 5 and 7 show that the first exemplary lithographic mask employing the pattern of FIG. 2A for the patterned opaque material layer 34 of a lithographic mask 30 (See FIG. 1) provides a greater 1st/0th diffracted order ratio, i.e., greater ratio of the first diffracted order strength to the zeroth diffracted order strength. Thus, the first exemplary lithographic mask employing the pattern of FIG. 2A can provide an image having a greater image contrast (sharper image having well defined boundaries between a lithographically exposed region and an unexposed region) than the comparative exemplary lithographic mask for the purpose of printing an array of contact holes of the same size and pitch in a negative photoresist layer.

Figure 8:
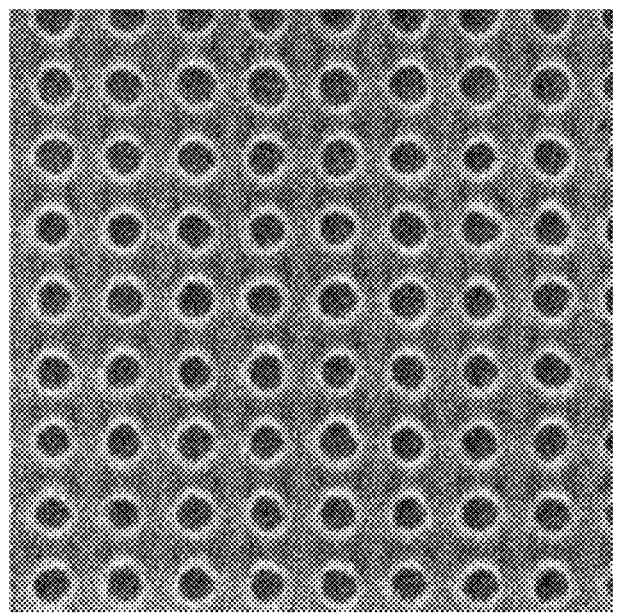
FIG. 8 is a scanning electron micrograph (SEM) picture of a photoresist that is lithographically exposed and developed employing a combination of the first exemplary lithographic mask of FIG. 2A and the illuminator of FIG. 2B. The pitch of the contact holes is 80 nm, which is close to the theoretical limit for printing with a projection lens of 1.35 NA at a wavelength of 193.5 nm.

FIG. 8 shows a scanning electron micrograph (SEM) picture of a photoresist that is lithographically exposed and developed employing a combination of the first exemplary lithographic mask of FIG. 2A and the illuminator of FIG. 2B. The array of contact holes in FIG. 8 has a pitch of 80 nm along the x direction (horizontal direction in FIG. 8) and a pitch of 80 nm along the y direction (vertical direction in FIG. 8). The process window, i.e. the tolerance of this printed feature to process variations such as defocus or dose error is large when using the combination of mask and illuminator depicted in FIG. 2A and FIG. 2B when printed at a wavelength of 193 nm and a numerical aperture of 1.35. The process window is much smaller for mask and illuminator combinations such as depicted in FIG. 3A and FIG. 3B because the image cannot achieve as high a contrast.

Figure 9:
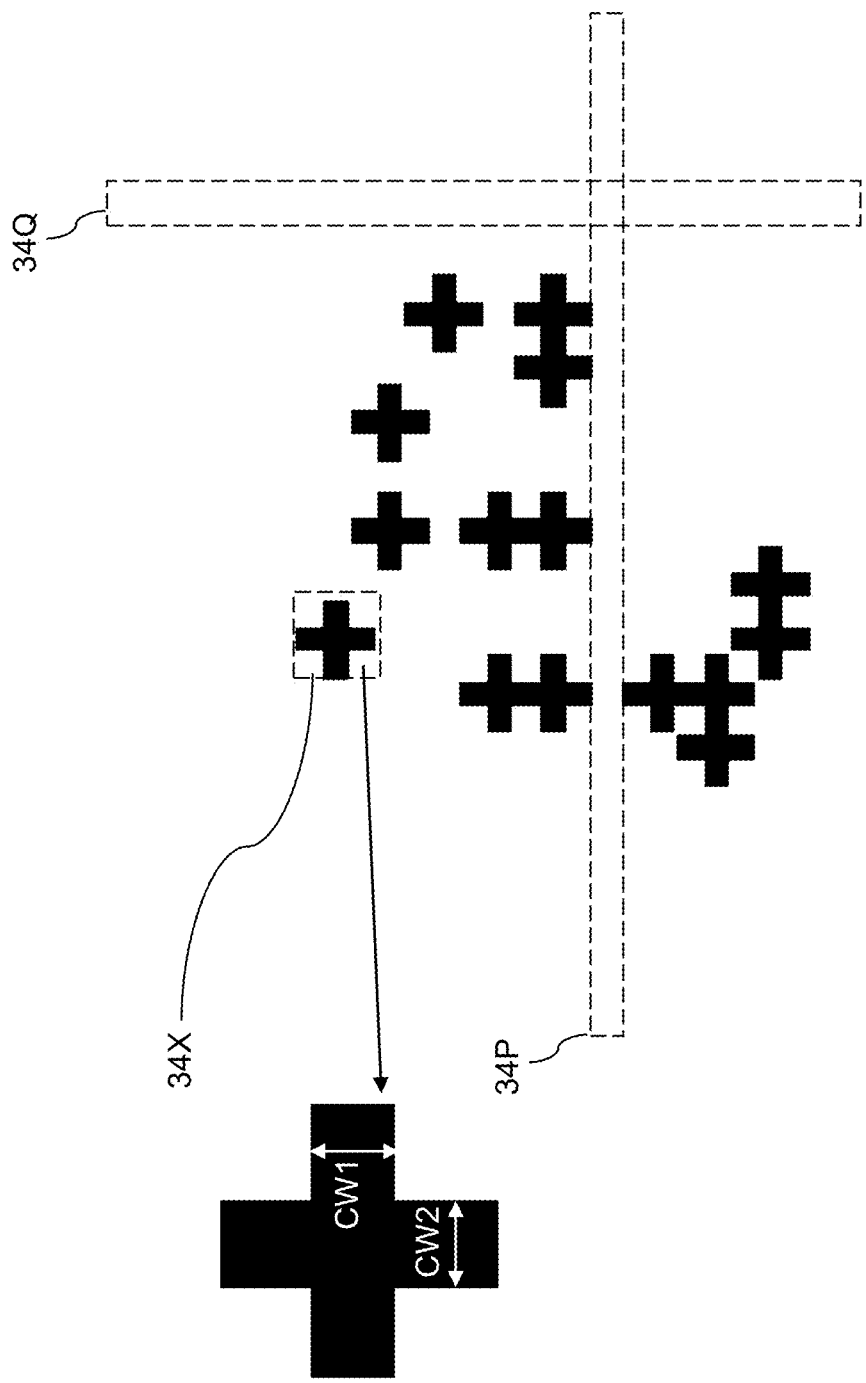
FIG. 9 is an exemplary design for a lithographic mask including discrete contact holes before optical proximity correction (OPC) according to an embodiment of the present disclosure.

Referring to FIG. 9, an exemplary design for a patterned opaque material layer 34 of a lithographic mask 30 (See FIG. 1) including discrete contact holes is shown without optical proximity correction (OPC). A design layout including a plurality of discrete contact holes located at intersection points of a rectangular grid is provided. The discrete contact holes occupy less than all sites of a rectangular two-dimensional array of contact holes. The discrete contact holes are located at selected sites on the rectangular grid, which is a two-dimensional lattice structure, and there exists at least one site of the two-dimensional lattice structure at which a contact hole is absent.

The exemplary design for the reticle, i.e., the lithographic mask, can be provided, for example, by first generating an opaque pattern including a criss-cross grid of intersections of a set of first parallel opaque subresolution assist features (SRAFs) 34Q and a set of second parallel opaque SLAFs 34Q that are perpendicular to the first parallel opaque SLAFs. A subresolution assist feature (SRAF) is a patterned feature on a photolithography mask that does not generate a corresponding printed image on a photoresist during lithographic exposure, but affects the printed image of other patterned features on the photolithography mask. The criss-cross grid of intersections of the set of first parallel opaque SRAFs 34P and the set of second parallel opaque SRAFs 34Q define a rectangular array of transparent regions, each of which is laterally bounded by a pair of first parallel opaque SRAFs 34P and a pair of second parallel opaque SRAFs 34Q. A plurality of rectangular openings is present within the criss-cross grid. In one embodiment, the plurality of rectangular openings can form a two-dimensional periodic array of openings.

The pitch of the first parallel opaque SRAFs 34P is herein referred to as a first pitch, and defines the minimum center-to-center distance between a pair of contact holes that can be printed on a photoresist layer 52 (See FIG. 1) along the direction of the first pitch. Specifically, the first pitch divided by the image reduction factor of the lithographic exposure tool is the minimum center-to-center distance between a pair of contact holes along the direction of the first pitch. Likewise, the pitch of the second parallel opaque SLAFs 34Q is herein referred to as a second pitch, and defines the minimum center-to-center distance between a pair of contact holes that can be printed on a photoresist layer 52 (See FIG. 1) along the direction of the second pitch. Specifically, the second pitch divided by the image reduction factor of the lithographic exposure tool is the minimum center-to-center distance between a pair of contact holes along the direction of the second pitch.

The width of the first parallel opaque SRAFs 34P, which is herein referred to as a first width, and the width of second parallel opaque SRAFs 34Q, which is herein referred to as a second width, are selected to ensure that the first parallel opaque SRAFs 34P and the second parallel opaque SRAFs 34Q do not form any direct printed image in areas of a photoresist layer 52 (See FIG. 1). The first width of the first parallel opaque SRAFs 34P can be from 1% to 30% of the first pitch, and the second width of the second parallel opaque SRAFs 34Q can be from about 1% to 30% of the second pitch. (Note: well, 1% would not be easy/possible to delineate on the mask, so in practice not possible).

The opaque pattern including a criss-cross grid of intersections of a set of first parallel opaque SRAFs 34P and a set of second parallel opaque SRAFs 34Q can be subsequently modified by substituting an opaque cross pattern 34X for each intersection of the criss-cross pattern that correspond to a contact hole in a design layout. Each opaque cross pattern 34 has a width along the direction of the first pitch of the first parallel opaque SRAFs 34P, which is herein referred to as a first cross width CW1. The first cross width CW1 is greater than the first width. Each opaque cross pattern 34 has another width along the direction of the second pitch of the second parallel opaque SRAFs 34Q, which is herein referred to as a second cross width CW2. The second cross width CW2 is greater than the second width. Thus, each opaque cross pattern has widths greater than the widths of the first parallel opaque SRAFs 34P and the second parallel opaque SRAFs 34Q.

In one embodiment, an opaque cross pattern 34 can be disjoined from the remaining criss-cross grid of intersections of the set of first parallel opaque SRAFs 34P and a set of second parallel opaque SRAFs 34Q. In another embodiment, an opaque cross pattern 34 can be contiguous with the remaining criss-cross grid of intersections of the set of first parallel opaque SRAFs 34P and a set of second parallel opaque SRAFs 34Q.

Figure 10:
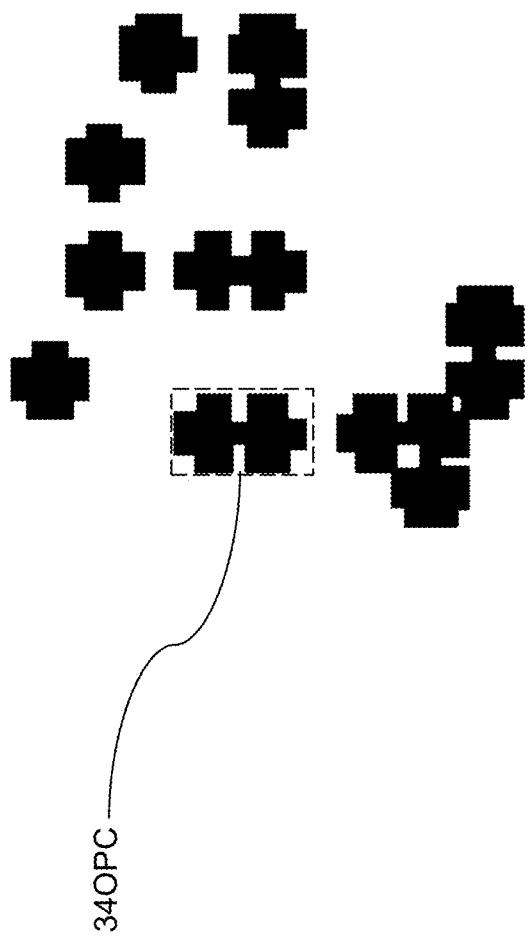
FIG. 10 is an exemplary design for a lithographic mask including discrete contact holes after performing optical proximity correction according to an embodiment of the present disclosure.

Referring to FIG. 10, optical proximity correction (OPC) can be optionally (Note: it is not optional if you really want randomly placed contacts to print at equal size) applied to the design including the opaque cross patterns. Each opaque cross pattern 34X can be modified into an opaque OPC'ed cross pattern 34OPC, i.e., an opaque cross pattern to which optical proximity correction is applied. A lithographic mask 30 including an opaque material layer 34 embodying the design with OPC can be manufactured, and subsequently employed to print a plurality of discrete contact holes in a photoresist layer 52 (See FIG. 1).

According to an embodiment of the present disclosure, a method for printing a plurality of contact holes in a photoresist is provided. The method includes providing a lithographic mask 30, i.e., a reticle, including a transparent substrate 32 and a patterned opaque material layer 34 thereupon (See FIG. 1). The patterned opaque material layer 34 includes a criss-cross grid of intersections of a set of first parallel opaque SRAFs 34P and a set of second parallel opaque SRAFs 34Q that are perpendicular to the first parallel opaque SRAFs 34P. The patterned opaque material layer 34 further includes discrete opaque cross patterns such as the opaque OPC'ed cross patterns 34OPC. The opaque OPC'ed cross patterns 34OPC can have widths greater than the first width of the first parallel opaque SRAFs 34P and the second width of the second parallel opaque SRAFs 34Q. The lithographic mask 30 can be loaded in a lithographic exposure tool. A substrate 50 with a negative photoresist layer thereupon can be loaded into the lithographic exposure tool. The negative photoresist layer can be lithographically exposed and developed to form a plurality of holes in areas of the lithographically exposed and developed negative photoresist layer that correspond to the discrete opaque cross patterns.

In one embodiment, the set of first parallel opaque SRAFs 34P and the set of second parallel opaque SRAFs 34Q can define a two dimensional array of rectangular openings within the patterned opaque material layer 34.

The first parallel opaque SRAFs 34P and the second parallel opaque SRAFs 34Q are not printed in the negative photoresist layer during lithographic exposure. Specifically, all areas of the negative photoresist layer corresponding to the portions of the patterned opaque material layer 34 other than the opaque OPC'ed cross patterns 34OPC (or opaque cross patterns 34X if OPC is not employed) upon scaled mapping of the pattern of the lithographic mask onto the area of the negative photoresist layer, are illuminated by the rays of the illumination beam, and lithographically exposed (i.e., the material of the negative photoresist becomes cross-linked) It is noted that cross-linked photoresist materials are formed only in a pure negative photoresist material, and does not occur in a negative tone development of a photoresist material. Thus, a remaining portion of the negative photoresist layer is present, after the lithographic exposure and development of the negative photoresist layer, for each area of the criss-cross grid of intersections.

In one embodiment, the criss-cross grid of intersections includes a two-dimensional periodic array, and the set of first parallel opaque SRAFs 34P has a first pitch and the set of second parallel opaque SRAFs 34Q has a second pitch.

In one embodiment, the first width, i.e., the width of each of opaque SRAF among the set of first parallel opaque SRAFs 34P, can be in a range from 1% of the first pitch to 30% of the first pitch. In one embodiment, the second width, i.e., the width of each of opaque SRAF among the set of second parallel opaque SRAFs 34Q, can be in a range from 1% of the second pitch to 30% of the second pitch.

In one embodiment, the lithographic exposure tool includes a quadrupole illuminator having four discrete opening therein such as the quadrupole illuminator shown in FIG. 2B. For example, the four discrete openings can include a pair of first openings 120X aligned along a lengthwise direction that preferentially generates an image with contrast parallel to the opaque SLAFs 34Q and a pair of second openings 120Y aligned along a lengthwise direction that preferentially generate an image with contrast parallel to the opaque SLAFs 34P.

Figure 11:
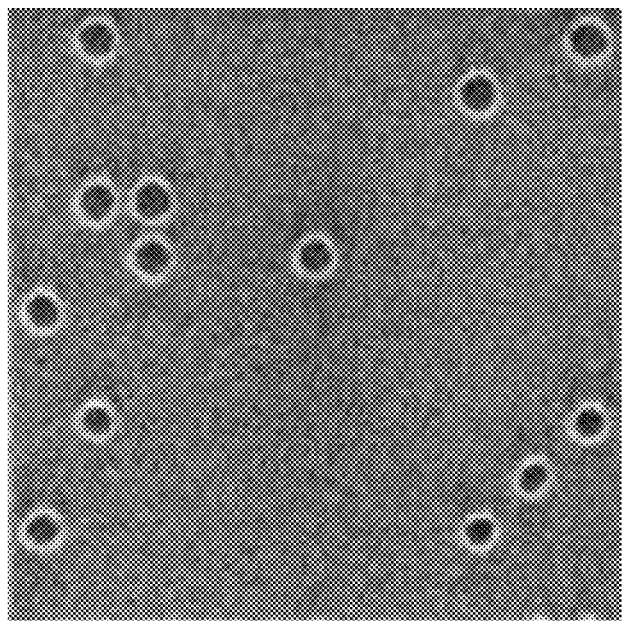
FIG. 11 is a scanning electron micrograph (SEM) picture of a photoresist that is lithographically exposed and developed employing a combination of a lithographic mask embodying a design similar to FIG. 10 and the illuminator of FIG. 2B. The contacts are random but the densest region have a pitch of 80 nm, identical to the SEM in FIG. 8.

Referring to FIG. 11, a scanning electron micrograph (SEM) picture of a negative photoresist that is lithographically exposed and developed employing a combination of a lithographic mask embodying a design similar to the design of FIG. 10 and the illuminator of FIG. 2B. The SEM picture shows that none of the first parallel opaque SLAFs 34P and the second parallel opaque SLAFs 34Q resulted in a printed feature in the developed negative photoresist layer.

Referring to FIG. 12A, a patterned opaque material layer 34 for a second exemplary lithographic mask is shown according to a first embodiment of the present disclosure. The area of the patterned opaque material layer 34 is shown in black areas. The second exemplary lithographic mask includes a pattern for a rectangular array of contact holes that can be printed on a negative photoresist.

Specifically, the patterned opaque material layer 34 can include a checkerboard pattern of discrete holes 34O and opaque material portions 34C'. In one embodiment, all of the opaque material portions 34C' can be interconnected among one another to form a single contiguous opaque material layer. The discrete holes 34O can form a two-dimensional rectangular periodic array having a first pitch along a first direction (e.g., the x direction or the horizontal direction of FIG. 12A), and having a second pitch along a second direction (e.g., the y direction or the vertical direction of FIG. 12A).

Another discrete hole 30O can be present at a location that is offset, relative to the position of a discrete hole 30O, by one half of the first pitch in the direction of the first pitch and by one half of the second pitch in the direction of the second pitch. As used herein, the position of each discrete hole 30O is measured at the geometrical center of the discrete hole 30O.

A lithographic mask 30 (See FIG. 1) employing a patterned opaque material layer 34 illustrated in FIG. 12A is a dark field mask that minimizes the impact of zeroth diffracted order radiation. When employed in conjunction with a negative photoresist, a pattern of isolated contact holes can be formed by lithographically unexposed portions of the negative photoresist that correspond to the intersections 34C of the patterned opaque material layer 34, i.e., by portions of the negative photoresist that are shielded by the illuminating electromagnetic radiation by the intersections 34C of the patterned opaque material layer 34.

The portions of the patterned opaque material layer 34 that do not belong to a center portion of each opaque material portion 34C' do not result in a printed lithographic image. All areas of the negative photoresist layer corresponding to the portions of the patterned opaque material layer 34 other than the center portions of the opaque material portions 34C' upon scaled mapping of the pattern of the lithographic mask onto the area of the negative photoresist layer, are illuminated by the rays of the illumination beam. Thus, all areas of the negative photoresist layer corresponding to the discrete holes 34O and peripheral portions of each opaque material portions 34C' upon scaled mapping of the pattern of the lithographic mask onto the area of the negative photoresist layer, are illuminated by the rays of the illumination beam. It is understood that the shape of each image of a center portion of the opaque material portion 34C', as printed in the negative photoresist layer, can be distorted from the shape of the corresponding opaque material portion 34C' due to lithographic effects (such as shape rounding).

The illumination of all areas of the negative photoresist layer corresponding to the portions of the patterned opaque material layer 34 other than the center portions of the opaque material portion 34C' upon scaled mapping is because the lithographic image of the pattern of the two-dimensional array in the patterned opaque material layer 34 includes two sinusoidal intensity variations that are juxtaposed on the image plane at the negative photoresist layer. Specifically, a first repetition pattern of the opaque material portions 34C' along a first diagonal direction D1 generates sinusoidal illumination intensity variation pattern along the corresponding diagonal direction at the plane of the negative photoresist layer, and a second repetition pattern of the opaque material portions 34C' along a second diagonal direction D2 generates sinusoidal illumination intensity variation pattern along the corresponding diagonal direction at the plane of the negative photoresist layer. Thus, only the areas of the negative photoresist layer corresponding to the area of the center portions of the opaque material portion 34C are illuminated with sufficiently low intensity of diffracted rays of the illumination beam so as to prevent exposure or cross-linking of the negative photoresist material, while all other areas of the negative photoresist layer are illuminated with sufficiently high intensity of diffracted rays of illumination beams and become lithographically exposed, i.e., exposure or cross-linking of the negative photoresist material occurs therein. It is noted that, for negative tone development, a cross-linking effect is not needed.

A quadrupole illuminator 12B illustrated in FIG. 12B can be employed in a lithographic exposure tool with a lithographic mask 30 (See FIG. 1) having a patterned opaque material layer 34 illustrated in FIG. 12A in a lithographic apparatus illustrated in FIG. 1 to print a rectangular array of contact holes in a negative photoresist, which can be in a photoresist layer 52 of FIG. 1. The quadrupole illuminator has four discrete openings therein. The quadrupole illuminator 12B of FIG. 12B can be optimized to reduce the zeroth diffraction order rays of the illumination beam. Thus, the area corresponding to the source image of the light source 10 is blocked within the quadrupole illuminator 12B.

The four discrete openings in the quadrupole illuminator can be aligned along four direction of most proximate neighboring discrete holes 34O relative to a discrete hole 34O within the lithographic mask of FIG. 12A. In one embodiment, the quadrupole illuminator 12A can have a pair of first openings 120Q1 located along the first diagonal direction D1 of the lithographic mask of FIG. 12A, and a pair of second openings 120Q2 located along the second diagonal direction D2 of the lithographic mask of FIG. 12A. If we have a circle of radius one within the square of FIG. 12B as a possible source of illumination that irradiates the mask, in one embodiment, the lateral distance between the geometrical centers of the pair of first openings 120Q1 can be about $\lambda/NA/p$, in which $\lambda$ is the wavelength of the illumination beam, NA is the numerical aperture of the lithographic apparatus, and p is the pitch of the contact holes along the diagonal direction D1 or D2. The distance of the geometrical center of the openings 120Q1 and 120Q2 from the center of the circle is roughly $\lambda/NA/p/2$. The optimal location of the openings 120Q1 and 120Q2 is thus dependent on the pitch of the contact holes on the mask. In one embodiment, the lateral distance between the geometrical centers of the pair of second openings 120Q2 can also be about $\lambda/NA/p$.

In one embodiment, a plurality of contact holes can be printed in a photoresist layer 52 (See FIG. 1), for example, by providing a reticle, i.e., a lithographic mask 30, including a transparent substrate 32 and a patterned opaque material layer 34 thereupon. The patterned opaque material layer can have the pattern illustrated in FIG. 12A. The reticle can be loaded into such a lithographic exposure tool as illustrated in FIG. 1. A substrate 50 with a photoresist layer 52, which can be a negative photoresist layer, thereupon can be loaded into the lithographic exposure tool. The negative photoresist layer can be lithographically exposed and developed. An array of holes can be formed in areas of the lithographically exposed and developed negative photoresist layer that correspond to center portions of the opaque material portions 34C'.

The negative photoresist layer is developed after lithographic exposure. After the lithographic exposure and development of the negative photoresist layer, a remaining portion of the negative photoresist layer is present for each area of the reticle located outside the center portions of the opaque material portions 34C'. Thus, the lithographically exposed portions of the negative photoresist layer have the same pattern as the pattern of a combined area that includes the discrete holes 34O and peripheral portions of the opaque material portions 34C'.

In one embodiment, a remaining portion of the negative photoresist layer is present, after the lithographic exposure and development of the negative photoresist layer, for each area of the lithographic mask located outside a center portion of each opaque material portion 34C'. In one embodiment, a remaining portion of the negative photoresist layer is present, after the lithographic exposure and development of the negative photoresist layer, for each opaque area of the lithographic mask located between center portions of a neighboring pair of opaque material portions 34C'.

In one embodiment, the fraction of the opaque area of the lithographic mask of FIG. 12A relative to the total area of the pattern in the lithographic mask can be greater than 50%. In one embodiment, the fraction of the opaque area of the lithographic mask of FIG. 12A relative to the total area of the pattern in the lithographic mask can be between 50% and 99%.

The various lithographic masks of the present disclosure, when employed in combination with an accompanying quadrupole illuminator, can provide high contrast printed images of an array of contact holes on a negative photoresist layer.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method for printing a plurality of contact holes in a photoresist, said method comprising:
    providing a reticle including a transparent substrate and a patterned opaque material layer thereupon, said patterned opaque material layer comprising a criss-cross grid of intersections of a set of first parallel opaque lines and a set of second parallel opaque lines;
    loading said reticle in a lithographic exposure tool;
    loading a substrate with a negative photoresist layer thereupon into said lithographic exposure tool; and
    lithographically exposing said negative photoresist layer to diffracted rays of an illumination beam passing through said reticle and developing said negative photoresist layer, wherein an array of holes is formed in areas of said lithographically exposed and developed negative photoresist layer that correspond to intersections of said set of first parallel opaque lines and said set of second parallel opaque lines.

2. The method of claim 1, wherein said set of first parallel opaque lines and said set of second parallel opaque lines define a two dimensional array of rectangular openings within said patterned opaque material layer.

3. The method of claim 1, wherein a remaining portion of said negative photoresist layer is present, after said lithographic exposure and development of said negative photoresist layer, for each area of said reticle located outside said intersections.

4. The method of claim 1, wherein said criss-cross grid of intersections comprises a two-dimensional periodic array, wherein said set of first parallel opaque lines has a first pitch and said set of second parallel opaque lines has a second pitch.

5. The method of claim 4, wherein a width of each of opaque line among said set of first parallel opaque lines is in a range from 31.25% of said first pitch to 62.5% of said first pitch.

6. The method of claim 1, wherein said lithographic exposure tool comprises a quadrupole illuminator having four discrete openings therein.

7. The method of claim 6, wherein said four discrete openings comprise a pair of first openings aligned along a perpendicular direction of said set of first parallel opaque lines and a pair of second openings aligned along a perpendicular direction of said set of second parallel opaque lines.

8. A system for printing a plurality of contact holes in a photoresist, said system comprising a lithographic exposure tool, and said reticle of claim 1 loaded into said lithographic exposure tool.

9. A method of generating a design for a patterned opaque material layer of a reticle, said method comprising:
    generating a pattern including a criss-cross grid of intersections of a set of first parallel opaque subresolution assist features (SRAFs) and a set of second parallel opaque SRAFs that are perpendicular to said first parallel opaque SRAFs;

modifying said pattern by substituting an opaque cross pattern for each intersection of said criss-cross pattern that correspond to a contact hole in a design layout, said opaque cross pattern having widths greater than said first parallel opaque SRAFs and said second parallel opaque SRAFs; and generating a design for a patterned opaque material layer of a reticle by applying optical proximity correction to said modified pattern.

10. The method of claim 9, wherein a plurality of rectangular openings is present within said criss-cross grid.

11. A method for printing a plurality of contact holes in a photoresist, said method comprising:

providing a reticle including a transparent substrate and a patterned opaque material layer thereupon, said patterned opaque material layer comprising:

a criss-cross grid of intersections of a set of first parallel opaque subresolution assist features (SRAFs) and a set of second parallel opaque SRAFs that are perpendicular to said first parallel opaque SRAFs, and discrete opaque cross patterns having widths greater than said first parallel opaque SRAFs and said second parallel opaque SRAFs;

loading said reticle in a lithographic exposure tool;

loading a substrate with a negative photoresist layer thereupon into said lithographic exposure tool; and lithographically exposing said negative photoresist layer to diffracted rays of an Illumination beam passing through said reticle and developing said negative photoresist layer, wherein a plurality of holes is formed in areas of said lithographically exposed and developed negative photoresist layer that correspond to said discrete opaque cross patterns.

12. The method of claim 11, wherein said set of first parallel opaque SRAFs and said set of second parallel opaque SRAFs define a two dimensional array of rectangular openings within said patterned opaque material layer.

13. The method of claim 11, wherein a remaining portion of said negative photoresist layer is present, after said lithographic exposure and development of said negative photoresist layer, for each area of said criss-cross grid of intersections.

14. The method of claim 11, said criss-cross grid of intersections comprises a two-imensional periodic array, wherein said set of first parallel opaque SRAFs has a first pitch and said set of second parallel opaque SRAFs has a second pitch.

15. The method of claim 14, wherein a width of each of said set of first parallel opaque lines is in a range from 1% of said first pitch to 30% of said first pitch.

16. The method of claim 11, wherein said lithographic exposure tool comprises a quadrupole illuminator having four discrete openings therein.

17. The method of claim 16, wherein said four discrete openings comprises a pair of first openings aligned along a perpendicular direction of said set of first parallel opaque lines and a pair of second openings aligned along a perpendicular direction of said set of second parallel opaque lines.

18. A system for printing a plurality of contact holes in a photoresist, said system comprising a lithographic exposure tool, and said reticle of claim 11 as loaded into said lithographic exposure tool.

19. A method for printing a plurality of contact holes in a photoresist, said method comprising:

providing a reticle including a transparent substrate and a patterned opaque material layer thereupon, said patterned opaque material layer comprising a checkerboard pattern of discrete holes and opaque material portions, wherein said opaque material portions are interconnected among one another;

loading said reticle in a lithographic exposure tool;

loading a substrate with a negative photoresist layer thereupon into said lithographic exposure tool;

lithographically exposing said negative photoresist layer to diffracted rays of an Illumination beam passing through said reticle and developing said negative photoresist layer, wherein an array of holes is formed in areas of said lithographically unexposed and developed negative photoresist layer that correspond to center portions of said opaque material portions.

20. The method of claim 19, wherein said discrete holes are a two dimensional array of rectangular openings within said patterned opaque material layer.

21. The method of claim 19, wherein a remaining portion of said negative photoresist layer is present, after said lithographic exposure and development of said negative photoresist layer, for each area of said reticle located outside a center portion of each opaque material portion.

22. The method of claim 21, wherein a remaining portion of said negative photoresist layer is present, after said lithographic exposure and development of said negative photoresist layer, for each opaque area of said reticle located between center portions of a neighboring pair of opaque material portions.

23. The method of claim 19, wherein said lithographic exposure tool comprises a quadrupole illuminator having four discrete openings therein.

24. The method of claim 23, wherein said four discrete openings in said quadrupole illuminator are aligned along four directions of most proximate neighboring discrete holes for a discrete hole within said reticle.

25. A system for printing a plurality of contact holes in a photoresist, said system comprising a lithographic exposure tool, and said reticle of claim 19 as loaded into said lithographic exposure tool.

* * * * *